US008937485B2

(12) United States Patent
Kim et al.

(10) Patent No.: US 8,937,485 B2
(45) Date of Patent: Jan. 20, 2015

(54) LIQUID CRYSTAL DISPLAY

(75) Inventors: Jung-Yun Kim, Yongin (KR); Chul-Ho Kim, Yongin (KR); Dong-Hoon Lee, Yongin (KR); Gyung-Soon Park, Yongin (KR); Seung-Kyu Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 1057 days.

(21) Appl. No.: 12/981,006

(22) Filed: Dec. 29, 2010

(65) Prior Publication Data

US 2011/0221719 A1 Sep. 15, 2011

(30) Foreign Application Priority Data

Mar. 10, 2010 (KR) ........................ 10-2010-0021259

(51) Int. Cl.
*G01R 31/26* (2014.01)
*G09G 3/36* (2006.01)

(52) U.S. Cl.
CPC ...... *G09G 3/3648* (2013.01); *G09G 2300/0426* (2013.01)
USPC .............. 324/760.01; 324/762.01; 324/750.3; 345/87

(58) Field of Classification Search
USPC ............. 324/760.01, 760.02, 761.02, 762.01, 324/750.3
See application file for complete search history.

(56) References Cited

U.S. PATENT DOCUMENTS

| | | | | |
|---|---|---|---|---|
| 5,774,100 | A * | 6/1998 | Aoki et al. | 345/87 |
| 6,310,667 | B1 * | 10/2001 | Nakayoshi et al. | 349/42 |
| 7,429,970 | B2 * | 9/2008 | Tsai et al. | 345/87 |
| 8,063,865 | B2 * | 11/2011 | Ishii et al. | 345/98 |
| 8,174,280 | B2 * | 5/2012 | Hung | 324/760.01 |
| 2007/0001711 | A1 * | 1/2007 | Kwak | 324/770 |
| 2010/0141293 | A1 * | 6/2010 | Chen et al. | 324/770 |

FOREIGN PATENT DOCUMENTS

| | | | |
|---|---|---|---|
| KR | 10-2003-0058107 | A | 7/2003 |
| KR | 10-2005-0111127 | A | 11/2005 |
| KR | 10-2007-0020608 | A | 2/2007 |
| KR | 10-2008-0052919 | A | 6/2008 |

* cited by examiner

*Primary Examiner* — Richard Isla Rodas
(74) *Attorney, Agent, or Firm* — Knobbe Martens Olson & Bear LLP

(57) ABSTRACT

A liquid crystal display (LCD) includes a pixel unit having pixels, each of the pixels positioned at a corresponding intersection of gate lines and data lines. A drive circuit unit is positioned at one side of the pixel unit to supply driving signals to the gate lines and the data lines. Test pads are connected to the data lines. In the LCD, each of the data lines is electrically connected between the pixel unit and the drive circuit unit via one or more lines among a first line formed in a first layer and a second line formed in a second layer, and wherein each of the data lines is connected to a different test pad from the test pad connected to adjacent data lines in each of the first and second layers.

26 Claims, 5 Drawing Sheets

LIQUID CRYSTAL DISPLAY

CROSS-REFERENCE TO RELATED APPLICATION

This application claims the benefit of Korean Patent Application No. 10-2010-0021259, filed Mar. 10, 2010, in the Korean Intellectual Property Office, the disclosure of which is incorporated herein by reference.

BACKGROUND

1. Field

Aspects of the present invention relate to a liquid crystal display (LCD), and more particularly, to an LCD capable of performing a failure detection test while ensuring stability of data lines.

2. Description of the Related Art

Since liquid crystal displays (LCDs) have advantages of a small size, a light weight, low power consumption and the like, they have gradually come into the spotlight as an alternative means to overcome the disadvantages of existing cathode ray tubes (CRTs). Accordingly, the LCDs are used for not only portable devices such as mobile phones and portable digital assistants (PDAs) but also medium and large sized products such as monitors and TVs. LCDs are divided into landscape type LCDs and portrait type LCDs according to a direction in which images are displayed. As attention to displays suitable for watching movies and the like has recently increased, use of the landscape type LCDs has been rapidly increased.

A landscape type LCD has a width in a horizontal direction of a screen, which is larger than a height in a vertical direction of the screen. In other words, the screen of the landscape type LCD has a rectangular shape rather than a square shape. A drive circuit unit driving pixels of the landscape type LCD is provided at one side of a panel, e.g., at the right side of the screen. However, in the landscape type LCD, a larger number of pixels are arranged in the horizontal direction, and therefore, data lines are as many in number as the number of pixels. Accordingly, a degree of proximity between the data lines is increased. Particularly, since a large number of data lines are disposed in a narrow area in which the data lines are extended from the drive circuit, a spacing distance between the data lines is not sufficiently secured. Therefore, it is highly likely that a short circuit defect and the like occur.

SUMMARY

According to aspects of the present invention, there is provided a liquid crystal display (LCD) capable of easily performing a failure detection test while ensuring stability of data lines.

According to an aspect of the present invention, there is provided an LCD including a pixel unit having pixels, each of the pixels positioned at a corresponding intersection of gate lines and data lines; a drive circuit unit positioned at one side of the pixel unit to supply driving signals to the gate lines and the data lines; and test pads connected to the data lines, wherein each of the data lines is electrically connected between the pixel unit and the drive circuit unit via one or more lines among a first line formed in a first layer and a second line formed in a second layer, and wherein each of the data lines is connected to a different test pad from the test pad connected to adjacent data lines in each of the first and second layers.

According to another aspect of the present invention, the data lines are consecutively disposed between the pixel unit and the drive circuit unit and may be sequentially connected to first to fourth test pads included in the test pads.

According to another aspect of the present invention, data lines connected to pixels on odd-numbered column lines and data lines connected to pixels on even-numbered column lines may be connected to the drive circuit unit by alternately passing through upper and lower dummy regions of the pixel unit.

According to another aspect of the present invention, the test pads may include first to fourth test pads. Data lines connected to pixels on (8k−7)-th ("k" is a natural number) or (8k−6)-th column lines may be connected to the first test pad. Data lines connected to pixels on (8k−5)-th or (8k−4)-th column lines may be connected to the second test pad. Data lines connected to pixels on (8k−3)-th or (8k−2)-th column lines may be connected to the third test pad. Data lines connected to pixels on (8k−1)-th or 8k-th column lines may be connected to the fourth test pad.

According to another aspect of the present invention, an electric potential of a test signal supplied to the first and second test pads may be different from an electric potential of a test signal supplied to the third and fourth test pads, or an electric potential of a test signal supplied to the first and third test pads may be set to be different from an electric potential of a test signal supplied to the second and fourth test pads.

According to another aspect of the present invention, the data lines may be alternately positioned in the first layer and the second layer in a first area A in which they extend from the drive circuit unit and be all positioned in the second layer in a second area B in which they are connected to the pixels between the pixel unit and the drive circuit unit.

According to another aspect of the present invention, the data lines positioned in the first layer in the first area A may be connected from the first line formed in the first layer to the second line formed in the second layer through contact holes in a third area C, and wherein the third area C is disposed between the first area A and the second area B.

According to another aspect of the present invention, the data lines positioned in the second layer in the first area A may be connected from the second line formed in the second layer to the first line formed in the first layer via contact holes in the third area C in which they are disposed between the first area A and the second area B and wherein the data lines positioned in the first layer in the third area C are then connected from the first line formed in the first layer to the second line formed in the second layer via other contact holes.

According to another aspect of the present invention, a spacing distance between adjacent data lines positioned in the second layer in the second area B may be wider than that on a plane between adjacent data lines alternately positioned in the first layer and the second layer in the first area A.

According to another aspect of the present invention, each of the pixels may include a thin film transistor including a semiconductor layer; a gate electrode formed on the semiconductor layer with a gate insulting layer interposed therebetween; and source and drain electrodes formed on the gate electrode with an interlayer insulating layer interposed therebetween and connected to the semiconductor layer.

According to another aspect of the present invention, the first line may be formed of the same material and in the same layer as the gate electrode, and the second line may be formed of the same material and in the same layer as the source and drain electrodes.

According to another aspect of the present invention, a width of the LCD may be larger than a height of the LCD so that the LCD is implemented as a landscape type display.

According to aspects of the present invention, each of the data lines is electrically connected between the pixel unit and the drive circuit unit via one or more lines among the first line formed in the first layer and the second line formed in the second layer, and is connected to a different test pad than test pads connected to adjacent data lines in each of the first and second layers. Accordingly, a failure detection test such as the visual inspection can be easily performed.

According to another aspect of the present invention, the data lines are alternately positioned in the first and second layers in a narrow area in which it is difficult to sufficiently secure a spacing distance between adjacent data lines, so that it is possible to prevent a short defect between the data lines, thereby ensuring the stability of the data lines.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
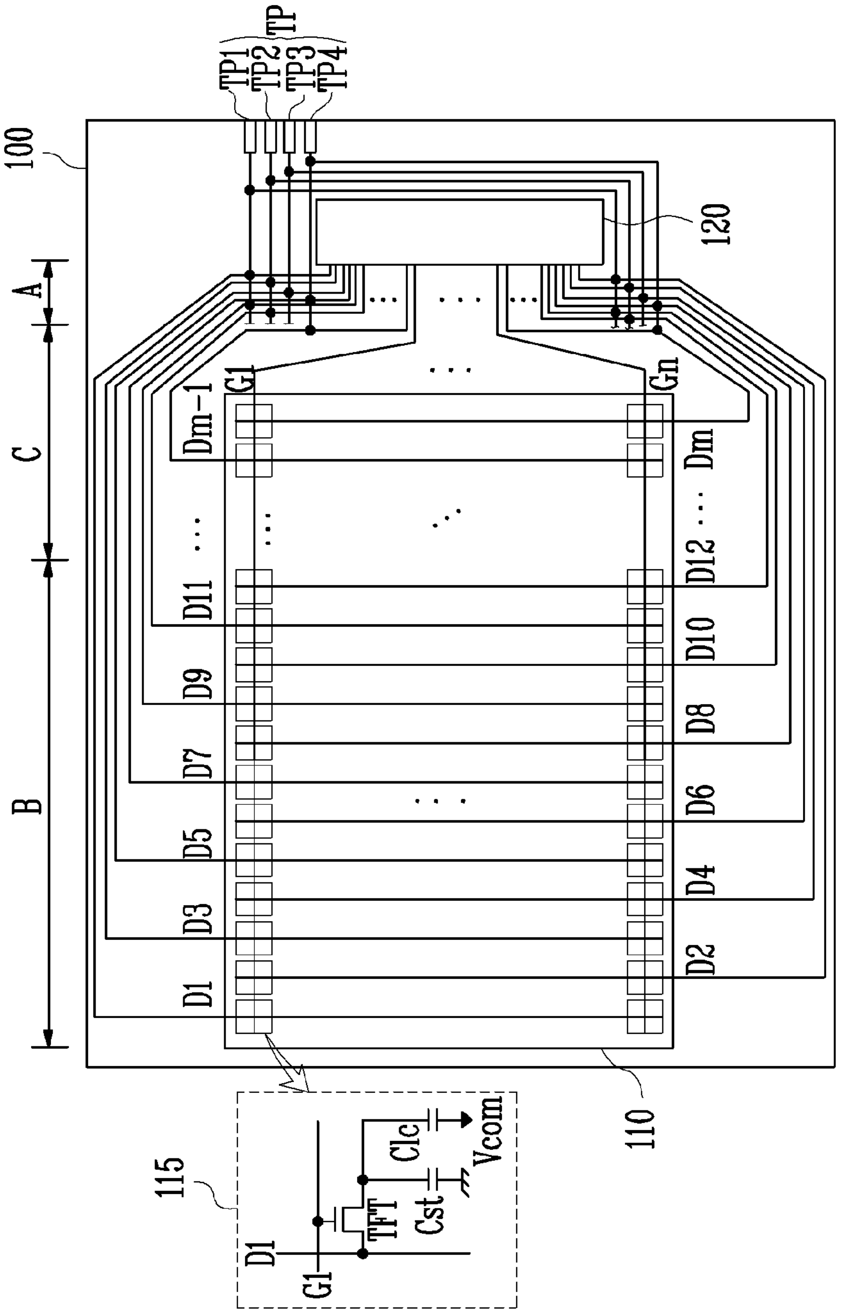
FIG. 1 is a plan view schematically showing a liquid crystal display (LCD) according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

It is to be understood that where is stated herein that a first element is said to be disposed or formed "on" or "in" or "connected to" a second element, the first element can directly contact the second element, or can be separated from the second element by one or more other elements located therebetween. In contrast, when an element is referred to as being disposed or formed "directly on" or "directly connected to" another element, there are no intervening elements present.

Figure 2:
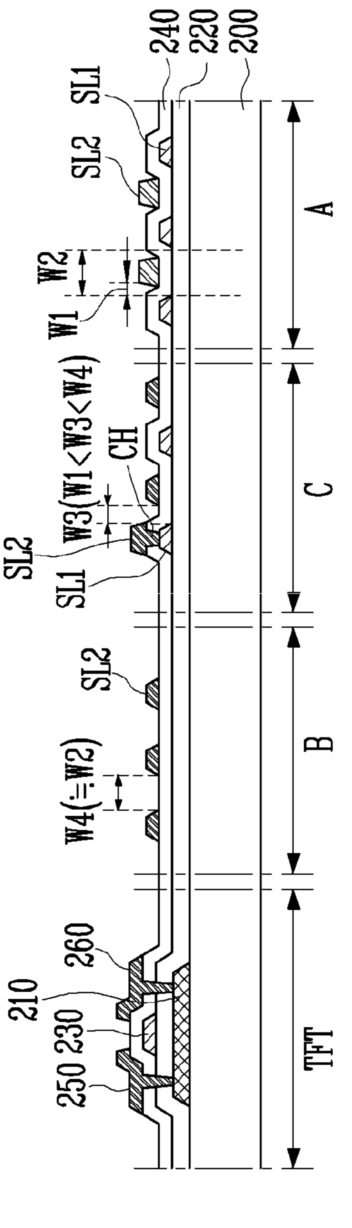
FIG. 2 is a main part sectional view schematically showing a thin film transistor included in each pixel of FIG. 1 and first and second lines formed in A, B and C areas.

FIG. 1 is a plan view schematically showing a liquid crystal display (LCD) according to an embodiment of the present invention. Particularly, an LCD panel is shown in FIG. 1. FIG. 2 is a main part sectional view schematically showing a thin film transistor included in each pixel of FIG. 1 and first and second lines formed in A, B and C areas. Referring to FIG. 1, the LCD 100 according to the present embodiment of the present invention includes a pixel unit 110 having pixels 115 positioned at intersection portions of gate lines G1 to Gn and data lines D1 to Dm; a drive circuit unit 120 supplying a drive signal to the pixels 115; and test pads TP supplying a test signal to the data lines D1 to Dm.

The pixel unit 110 has the pixels 115 arranged in a matrix form, wherein each one of the pixels 115 is disposed at the intersection portions of the gate lines G1 to Gn and the data lines D1 to Dm. Each of the pixels 115 includes a thin film transistor TFT connected to corresponding ones of the gate lines G1 to Gn and the data lines D1 to Dn; a storage capacitor Cst connected to the thin film transistor TFT; and a liquid crystal capacitor Clc. The thin film transistor TFT is connected between the data line D and a connection node of the storage capacitor Cst and the liquid crystal capacitor Clc, and a gate electrode of the thin film transistor TFT is connected to the gate line G. When a scan signal is supplied from the gate line G, the thin film transistor TFT is turned on to supply a data signal supplied from the data line D to the storage capacitor Cst.

The storage capacitor Cst stores a voltage corresponding to the data signal supplied via the thin film transistor TFT therein and maintains the stored voltage during one frame. The liquid crystal capacitor Clc is a representation of liquid crystals between a pixel electrode (not shown) connected to the thin film transistor TFT and a common electrode (not shown). The liquid crystal capacitor Clc controls a light transmittance of liquid crystals corresponding to the voltage stored in the storage capacitor Cst.

Meanwhile, as an example, the pixel unit 110 has a width in the horizontal direction that is larger than a height in the vertical direction. That is, the LCD of this embodiment is implemented as a landscape type or in other words, has a rectangular shape. In this case, the gate lines G1 to Gn are arranged along a long-side direction in the interior of the pixel unit 110. Each of the gate lines G1 to Gn is extended and connected to the drive circuit unit 120 while being commonly connected to pixels positioned on the same row line. The data lines D1 to Dm are arranged in a short-side direction in the interior of the pixel unit 110. Each of the data lines D1 to Dm is connected to the drive circuit unit 120 via an upper or lower dummy region (wiring region) while being commonly connected to pixels on the same column line.

At this time, a relatively large number of data lines D1 to Dm are arranged in the landscape type LCD, and therefore, the data lines D1 to Dm are routed to be distributed in the upper and lower dummy regions. For example, from among the data lines D1 to Dm, data lines D1, D3, . . . , Dm-1 are connected to pixels on odd-numbered column lines and data lines D2, D4, . . . , Dm are connected to pixels on even-numbered column lines. The data lines D1 to Dm are connected to the drive circuit unit 120 by alternately passing through the upper and lower dummy regions.

In the present embodiment, as shown in FIG. 1, the data lines D1, D3, . . . , Dm-1 are extended and connected to the drive circuit unit 120 via the upper dummy region of the pixel unit 110. Additionally, the data lines D2, D4, . . . , Dm are extended and connected to the drive circuit unit 120 via the lower dummy region of the pixel unit 110.

The drive circuit unit 120 is positioned at one side of the pixel unit 110 to supply a drive signal to the pixels 115. More specifically, the drive circuit unit 120 is connected to the pixels 115 through the gate lines G1 to Gn and the data lines D1 to Dm to drive the pixels 115. Thus, the drive circuit unit 120 includes a gate drive circuit (not shown) supplying a scan signal to the gate lines G1 to Gn and a data drive circuit (not shown) supplying a data signal to the data lines D1 to Dm.

The test pads TP are provided at one side of the panel, and are connected to the data lines D1 to Dm. The test pads TP receive a test signal testing the defect presence and the defect region of the data lines in a test process such as visual inspection (VI). The test signal is supplied from the exterior of the panel and the test pads supply the received test signal to the data lines D1 to Dm.

However, according to aspects of the present invention, the data lines D1 to Dm are formed so that adjacent data lines are positioned in different layers in a first area A in which the data lines D1 to Dm are extracted from the drive circuit unit 120. The data lines D1 to Dm are formed to be all positioned in the same layer in a second area B in which the data lines D1 to Dm are connected to the pixels. At this time, the data lines D1 to Dm are formed to be connected in different layers through contact holes in a third area C between the areas A and B.

That is, when the data lines D1 to Dm are connected between the pixel unit 110 and the drive circuit unit 120, they are formed to be alternately positioned in different layers, e.g., first and second layers, in the area A. The data lines D1 to Dm are alternately positioned in the different layers because it is difficult to secure a sufficient spacing distance between adjacent data lines when they are disposed in the same layer in the area A. Additionally, the data lines D1 to DM are positioned in the same layer, e.g., the second layer, in the area B, because more spacing distance between adjacent data lines is available as compared with that in the area A.

At this time, the ranges of the areas A, B and C are varied based on the design structure of the panel. For convenience of illustration, the area A is an area in which less spacing distance, thus decreasing a stability of the data lines D1 to Dm. In other words, the area A is a wiring region adjacent to the drive circuit unit 120 from which the data lines D1 to Dm extend.

The area B is an area in which the data lines D1 to Dm extend to the interior of the pixel unit 110 in order to connect to the pixels 115, i.e., an area in which the data lines D1 to Dm are all positioned in the same layer because the data lines D1 to Dm can be disposed with sufficient spacing distance between them. Particularly, as the data lines D1 to Dm are distant from the drive circuit unit 120, the number of the data lines D1 to Dm is decreased, thus requiring less space in order to have an adequate spacing distance between wires. Therefore, the area B is a wiring region spaced apart from the drive circuit unit 120 at a predetermined distance.

For example, FIG. 1 illustrates the data lines D1 and Dm extend in parallel with one another above and below the pixel unit 110. However, at least some of the data lines D1 to Dm extend toward the pixel unit 110 at a predetermined slope in the area B (or including the area C) in which the number of the extended data lines D1 to Dm is decreased. That is, in the area B, the spacing distance between adjacent data lines is sufficient due to the decreased number of data lines.

The area C is an area positioned between the areas A and Band has contact holes formed therein. In the area C, although the spacing distance between the data lines D1 to Dm is not secured as wide as that in the area B, the contact holes allow some data lines to be extended by changing a layer in which the data lines are disposed in the middle of the area C.

That is, according to aspects of the present invention, as shown in FIG. 2, the data lines D1 to Dm are alternatively disposed in different layers in the area A. The data lines D1 to Dm are disposed so as to changing a layer in which they are disposed in the middle of the area C. The data lines D1 and Dm are disposed in parallel with one another in a layer in which they are easily connected to thin film transistors TFT of the respective pixels 115 in the area B, which has the data lines disposed in the same layer.

This will be described in detail in conjunction with FIGS. 1 and 2. As one example, in the area A, the data lines D1 to Dm are alternately disposed in the first layer and the second layer. The first layer is a layer having a gate electrode 230 of the thin film transistor TFT provided to each of the pixels 115. The second layer is a layer having a source electrode 250 and a drain electrode 260 of the thin film transistor TFT provided to each of the pixels 115.

The thin film transistor TFT is shown as an example of the sectional positions of the data lines D1 to Dm. The thin film transistor TFT includes: a semiconductor layer 210 formed on a substrate 200; a gate electrode 230 formed on the semiconductor layer 210 with a gate insulating layer 220 interposed therebetween; and source and drain electrodes 250 and 260 formed on the gate electrode 230 with an interlayer insulating layer 240 interposed therebetween and connected to the semiconductor layer 210.

For convenience of illustration, connection lines formed in the first layer to constitute one regions of the respective data lines D1 to Dm are referred to as first lines SL1, and connection lines formed in the second layer to constitute other regions of the respective data lines D1 to Dm are referred to as second lines SL2.

At this time, the first lines SL1 are formed of the same material in the same layer as the gate electrode 230 of the thin film transistor TFT, and the second lines SL2 are formed of the same material in the same layer as the source and drain electrodes 250 and 260 of the thin film transistor TFT. However, aspects of the present invention are not limited thereto, and the first lines SL1 and the second lines SL2 may be formed of other suitable materials.

That is, each of the data lines D1 to Dm is electrically connected between the pixel unit 110 and the drive circuit unit 120 via one or more lines from among the first and second lines SL1 and SL2, which are respectively formed in the first and second layers. In the area A, the data lines D1 to Dm are formed so that adjacent data lines are alternately positioned in the first and second layers. Accordingly, a failure rate due to a short circuit defect between data lines, and other similar problems can be reduced.

Each of the data lines D1 to Dm is connected from the first line SL1 to the second line SL2 by a contact hole CH that passes through the interlayer insulating layer 240 in the area C. Meanwhile, the positions or frequencies at which the respective data lines D1 to Dm change layers in the area C are not all the same for all of the data lines D1 to Dm. In other words, in the area C, the positions or number of times in which the data lines D1 to Dm change layers may be different according to the space between the data lines D1 to Dm or resistance variation between the data lines D1 to Dm.

The respective data lines D1 to Dm are connected only to the second lines SL2 in the area B, in which sufficient spacing distance between adjacent data lines is available. The spacing distance W4 between adjacent data lines in the area B is designed to be approximately identical or similar to the spacing distance W2 between adjacent data lines in the same layer. However, aspects of the present invention are not limited thereto, and the spacing distance W4 may be other suitable distances. That is, the spacing distance W4 between adjacent data lines positioned in the second layer in the area B is designed to be wider than the spacing distance W1 on a plane between adjacent data lines alternately positioned in the first and second layers in the area A.

The spacing distance W3 is between at least some adjacent data lines among the adjacent data lines alternately positioned in the first and second layers in the area C. The spacing distance W3 is wider than the spacing distance on the plane between the adjacent data lines in the area A and is narrower than the spacing distance W4 between the adjacent data lines in the area B.

According to aspects of the present invention, each of the data lines D1 to Dm is connected to a different test pad TP from adjacent data lines in each of the first and second layers. Thus, as shown in FIG. 1, the test pads TP include first to fourth test pads TP1 to TP4. The data lines D1 to Dm, consecutively disposed in the respective upper and lower dummy regions of the pixel unit 110, are sequentially connected to the first to fourth test pads TP1 to TP4.

For example, data lines D1, D2, D9, D10, . . . connected to pixels on an (8k−7)-th ("k" is a natural number) or (8k−6)-th column line are connected to the first test pad TP1. Data lines D3, D4, D11, D12, . . . connected to pixels on an (8k−5)-th or (8k−4)-th column line are connected to the second test pad TP2. Data lines D5, D6, D13, D14, . . . connected to pixels on an (8k−3)-th or (8k−2)-th column line are connected to the third test pad TP3. Data lines D7, D8, D15, D16, . . . connected to pixels on an (8k−1)-th or 8k-th column line are connected to the fourth test pad TP4. Thus, if adjacent data lines in both of the first and second layers are connected to different test pads TP, a short circuit defect between adjacent data lines positioned in the same layer in both of the areas A and B, and the like can be detected, and defect regions can also be detected. This will be described in detail later with reference to FIGS. 3 to 4B.

Figure 3:
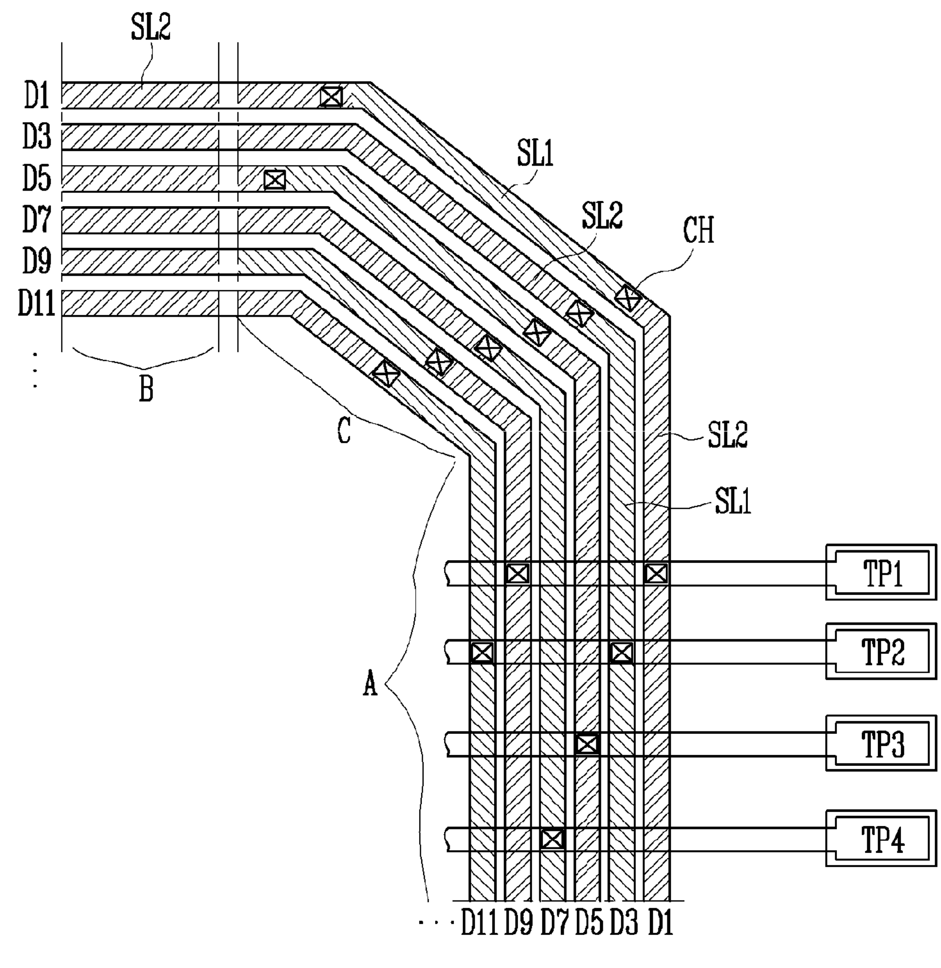
FIG. 3 is a main part enlarged plan view showing a wiring region in which data lines are formed in FIG. 1.

FIG. 3 is a main part enlarged plan view showing a wiring region in which the data lines are formed in FIG. 1. For convenience of illustration, only some data lines among the odd-numbered data lines connected via the upper dummy region of the pixel unit are shown in FIG. 3. Referring to FIG. 3, the data lines D1, D3, D5, D7, . . . are alternately positioned in the first and second layers in the area A.

For example, in the area A, the (8k−7)-th and (8k−3)-th data lines D1, D5, D9, D13 . . . are implemented as second lines SL2 formed of source and drain metals in the second layer. The (8k−5)-th and (8k−1)-th data lines D3, D7, D11, D15, . . . are implemented as first lines SL1 formed of a gate metal in the first layer. Accordingly, the adjacent data lines in the wiring region between the pixel unit 110 and the drive circuit unit 120, as illustrated in FIG. 1, are positioned in different layers in the area A.

The data lines D1, D3, D5, D7, . . . are all disposed in the same layer in the area B. For example, the data lines D1, D3, D5, D7, . . . are all implemented as second lines SL2 formed of the source and drain metals in the second layer in the area B. In this case, while passing through the area C, the data lines D3, D7, D11, D15, . . . positioned in the first layer in the area A are connected from first lines SL1 in the first layer to second lines SL2 in the second layer via contact holes CH. However, aspects of the present invention are not limited thereto. For example, at least some of the data lines D1, D5, D9, D13, . . . positioned in the second layer in the area A are not connected only to the second lines SL2 but may be connected to second lines SL2 via first lines SL1 in the middle while passing through the area B via the areas A and C.

In other words, at least some of the data lines D3, D7, D11, D15, . . . , which are positioned in the second layer in the area A, are connected to second lines SL2 in the second layer and are connected to first lines SL1 in the first layer via contact holes CH. Additionally, the at least some of the data lines are then connected from the first lines SL1 to the second lines SL2 in the second layer via other contact holes CH.

However, the amount of time the at least some of the data lines switch layers via contact holes CH may be experimentally determined to reduce the resistance variation due to the length variation between the data lines D1, D3, D5, D7, . . . , the antenna effect due to the increase of wires, or the like. For example, upon space for the data lines D1 to Dm in the area C being sufficient, the layer in which the data lines D1 to Dm are formed may be changed sequentially from the first data line D1 to the m-th data line Dm so that the resistances between the data lines D1, D3, D5, D7, . . . are similar. However, each of the data lines D1, D3, D5, D7, . . . is connected to a different test pad TP from adjacent data lines in both of the first and second layers.

For example, the (8k−7)-th data lines D1, D9, . . . are connected to the first test pad TP1. The (8k−5)-th data lines D3, D11, . . . are connected to the second test pad TP2. The (8k−3)-th data lines D5, D13, . . . are connected to the third test pad TP3, and the (8k−1)-th data lines D7, D15, . . . may be connected to the fourth test pad TP4.

At this time, the connection lines through which the data lines D1, D3, D5, D7, . . . are connected to the first to fourth test pads TP1 to TP4 are positioned in a third layer, which is different from the first and second layers, at intersections of the connection lines with at least the data lines D1, D3, D5, D7, . . . . For example, the connection lines are formed of the same material in the same layer as pixel electrodes at the intersection portions of the connection lines with at least the data lines D1, D3, D5, D7, . . . .

Meanwhile, as illustrated in FIG. 3, only some data lines D1, D3, . . . among the odd-numbered data lines are connected via the upper dummy region of the pixel unit. However, aspects of the present invention may be applied to the even-numbered data lines D2, D4, . . . , Dm connected via the lower dummy region of the pixel unit. A visual inspection method for the aforementioned data lines D1, D3, D5, D7, . . . will be described later with reference to FIGS. 4A and 4B.

Figure 4A:
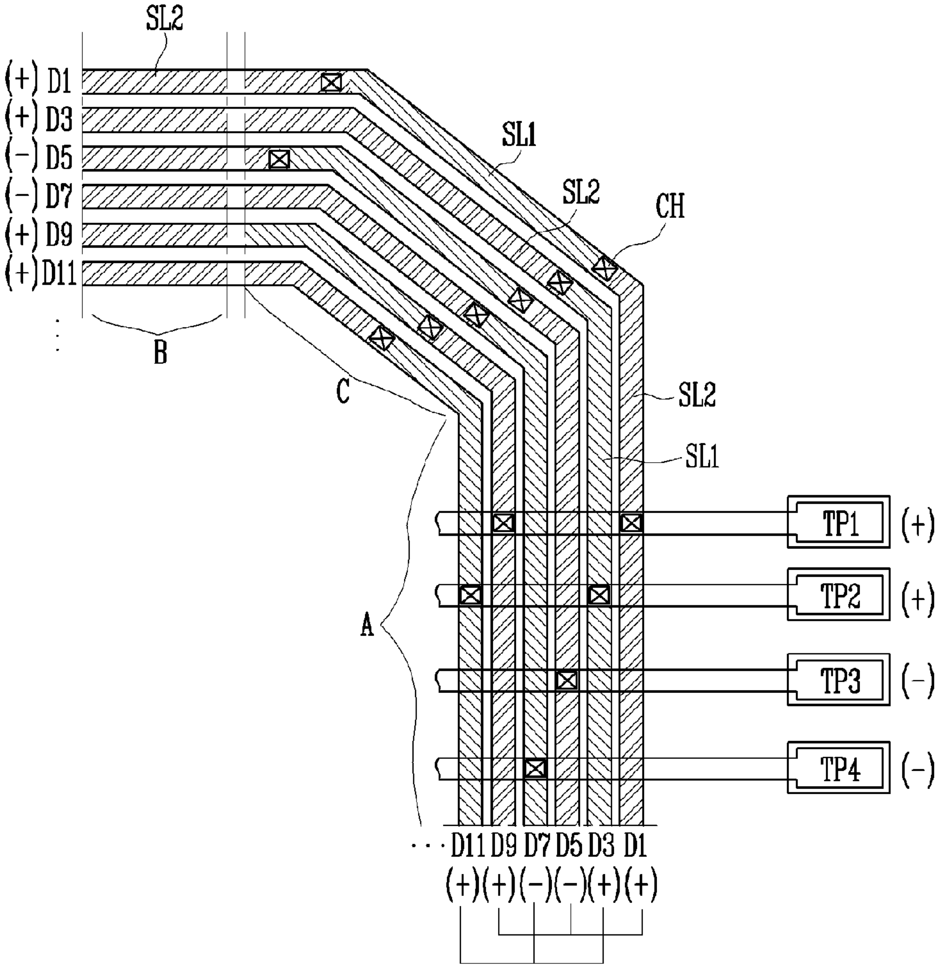
FIG. 4A is a main part plan view illustrating a testing method of data lines in area A shown in FIGS. 1 to 3.
Figure 4B:
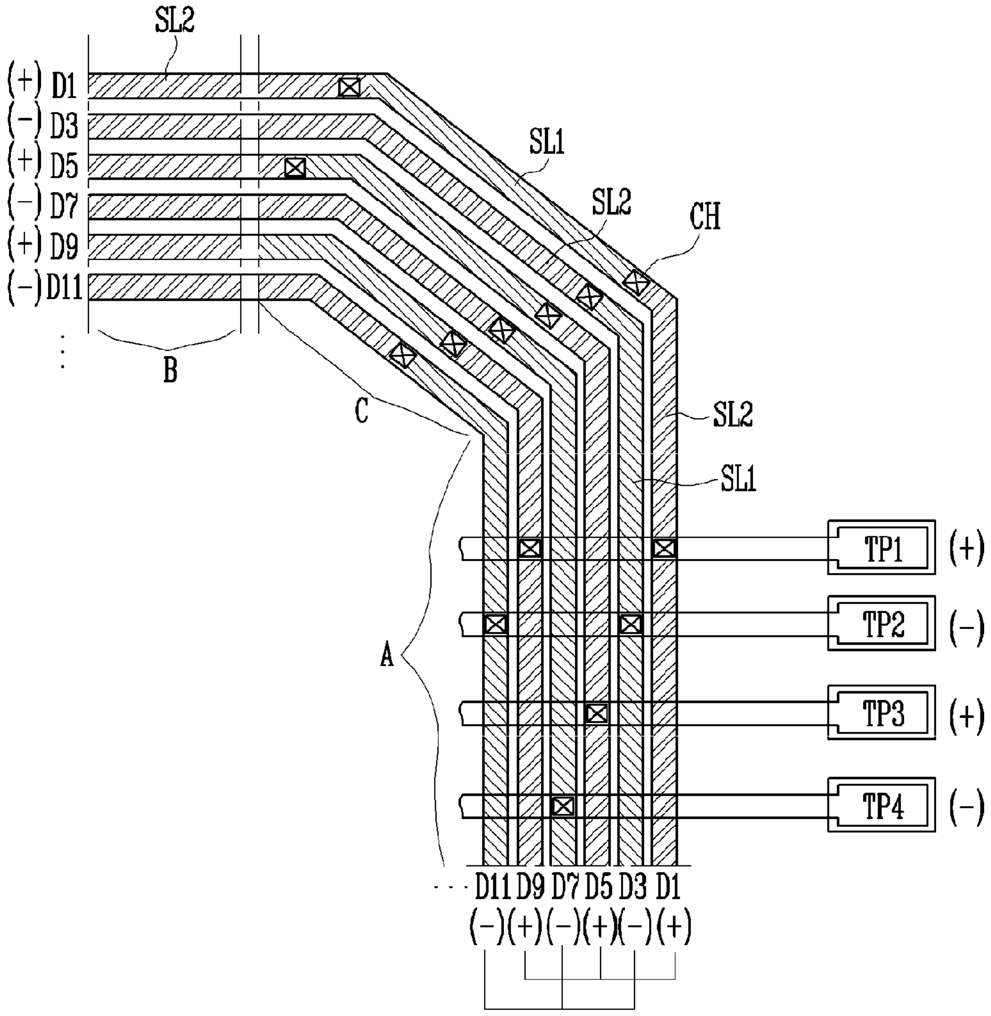
FIG. 4B is a main part plan view illustrating a testing method of data lines in area B shown in FIGS. 1 to 3.

FIG. 4A is a main part plan view illustrating a testing method of data lines in area A shown in FIGS. 1 to 3. FIG. 4B is a main part plan view illustrating a testing method of data lines in area B shown in FIGS. 1 to 3. Referring to FIG. 4A, a test signal having a first electric potential is supplied to the first and second test pads TP1 and TP2, and a test signal having a second electric potential different from the first electric potential is supplied to the third and fourth test pads TP3 and TP4.

For example, a test signal having a positive (+) electric potential is supplied to the first and second test pads TP1 and TP2, and a test signal having a negative (−) electric potential is supplied to the third and fourth test pads TP3 and TP4. In this example, the data lines D3, D7, D11, . . . positioned in the first layer in the area A, alternately receive test signals having positive (+) and negative (−) electric potentials. Thus, when a short circuit defect between adjacent data lines in the first layer occurs, it can be detected, and it can be seen that the short defect occurs in the area A. Similarly, the data lines D1, D5, D9, . . . positioned in the second layer in the area A, alternately receive test signals having positive (+) and negative (−) electric potentials. Thus, the presence of a short circuit defect in the second layer and the area in which the short circuit defect occurs can be detected.

Meanwhile, a test signal having a first electric potential is supplied to the first and third test pads TP1 and TP3. A test signal having a second electric potential from the first electric potential is supplied to the second and fourth test pads TP2 and TP4, so that the presence of a short circuit defect between data lines in the area B can be tested. For example, as shown in FIG. 4B, a test signal having a positive (+) electric potential is supplied to the first and third test pads TP1 and TP3, and a test signal having a negative (−) electric potential is supplied to the second and fourth test pads TP2 and TP4. In this example, test signal having different electric potentials are supplied to adjacent data lines in the area B in which the data lines D1, D3, D5, D7, . . . are all positioned in the second layer. Thus, when a short circuit defect between the adjacent data lines in the area B occurs, the presence of the short circuit defect can be detected, and it can be seen that the short circuit defect occurs in the area B or the area C.

As described above, according to aspects of the present invention, each of the data lines is electrically connected between the pixel unit and the drive circuit unit via one or more lines among the first line SL1 and the second line SL2. Also, each of the data lines is connected to a different test pad that a test pad connected to adjacent data lines in each of the first and second layers. Accordingly, a failure detection test such as the visual inspection can be easily performed.

The data lines are alternately positioned in the first and second layers in a narrow area in which it is difficult to sufficiently secure a spacing distance between adjacent data lines, thus, it is possible to prevent a short circuit defect between the data lines, thereby ensuring the stability of the data lines.

Meanwhile, according to aspects of the present invention, the landscape type LCD is disclosed as an exemplary embodiment and the data lines are densely disposed in the wiring region in the landscape type LCD. However, aspects of the present invention are not limited thereto. That is, when a plurality of signal wires are densely disposed in a narrow area, adjacent signal wires in the narrow area are disposed in different layers according to aspects of the present invention. Additionally, the signal wires are connected to different test pads than the test pads connected to adjacent signal wires in each of the layers. Thus, a failure detection test can be easily performed.

Although a few embodiments of the present invention have been shown and described, it would be appreciated by those skilled in the art that changes may be made in this embodiment without departing from the principles and spirit of the invention, the scope of which is defined in the claims and their equivalents

What is claimed is:

1. A liquid crystal display (LCD) comprising:

a pixel unit having pixels, each of the pixels positioned at a corresponding intersections of gate lines and data lines;

a drive circuit unit positioned at one side of the pixel unit to supply driving signals to the gate lines and the data lines; and test pads connected to the data lines, wherein each of the data lines is electrically connected between the pixel unit and the drive circuit unit via one or more lines among a first line formed in a first layer and a second line formed in a second layer, and wherein each of the data lines is connected to a different test pad from a test pad connected to adjacent data lines in each of the first and second layers, wherein each of the pixels has a thin film transistor comprising:

a semiconductor layer;

a gate electrode formed on the semiconductor layer with a gate insulting layer interposed therebetween; and source and drain electrodes formed on the gate electrode with an interlayer insulating layer interposed therebetween and connected to the semiconductor layer, wherein the first line is formed of the same material and in the same layer as the gate electrode, and wherein the second line is formed of the same material and in the same layer as the source and drain electrodes.

2. The LCD according to claim 1, wherein the data lines are consecutively disposed between the pixel unit and the drive circuit unit and are sequentially connected to first to fourth test pads included in the test pads.

3. The LCD according to claim 1, wherein data lines connected to pixels on odd-numbered column lines and data lines connected to pixels on even-numbered column lines are connected to the drive circuit unit by alternately passing through upper and lower dummy regions of the pixel unit.

4. The LCD according to claim 3, wherein the test pads comprise first to fourth test pads, wherein data lines connected to pixels on (8k−7)-th, "k" being a natural number, or (8k−6)-th column lines are connected to the first test pad, wherein data lines connected to pixels on (8k−5)-th or (8k−4)-th column lines are connected to the second test pad, wherein data lines connected to pixels on (8k−3)-th or (8k−2)-th column lines are connected to the third test pad, and wherein data lines connected to pixels on (8k−1)-th or 8k-th column lines are connected to the fourth test pad.

5. The LCD according to claim 4, wherein an electric potential of a test signal supplied to the first and second test pads is different from an electrical potential of a test signal supplied to the third and fourth test pads.

6. The LCD according to claim 4, wherein an electric potential of a test signal supplied to the first and third test pads is different from an electrical potential of a test signal supplied to the second and fourth test pads.

7. The LCD according to claim 1, wherein a width of the LCD is larger than a height of the LCD so that the LCD is implemented as a landscape type display.

8. A liquid crystal display (LCD) comprising:

a pixel unit having pixels, each of the pixels positioned at a corresponding intersections of gate lines and data lines;

a drive circuit unit positioned at one side of the pixel unit to supply driving signals to the gate lines and the data lines; and test pads connected to the data lines, wherein each of the data lines is electrically connected between the pixel unit and the drive circuit unit via one or more lines among a first line formed in a first layer and a second line formed in a second layer, wherein each of the data lines is connected to a different test pad from a test pad connected to adjacent data lines in each of the first and second layers, wherein the data lines are alternately positioned in the first layer and the second layer in a first area A in which they extend from the drive circuit unit and are all positioned in the second layer in a second area B in which they are connected to the pixels between the pixel unit and the drive circuit unit.

9. The LCD according to claim 8, wherein the data lines positioned in the first layer in the first area A are connected from the first line formed in the first layer to the second line formed in the second layer through contact holes in a third area C, and wherein the third area C is disposed between the first area A and the second area B.

10. The LCD according to claim 8, wherein the data lines positioned in the second layer in the first area A are connected from the second line formed in the second layer to the first line formed in the first layer via contact holes in the third area C in which they are disposed between the first area A and the second area C, and wherein the data lines positioned in the first layer in the third area C are then connected from the first line formed in the first layer to the second line formed in the second layer via other contact holes.

11. The LCD according to claim 8, wherein a spacing distance between adjacent data lines positioned in the second layer in the second area B is wider than a spacing distance on a plane between adjacent data lines alternately positioned in the first layer and the second layer in the first area A.

12. A liquid crystal display (LCD) having a pixel unit including pixels at intersections of gate lines and data lines, a drive circuit configured to supply driving signals to the gate lines and the data lines, and test pads connected to the data lines, the LCD comprising:

a first area having the data lines directly connected to the drive circuit and connected to the test pads;

a second area having the data lines extending into the pixel unit to connect to the pixels disposed at the intersections of the gate lines and data lines; and a third area having the data lines extending along a direction in which the pixel unit extends, the third area being disposed between the first area and the second area; and wherein adjacent ones of the data lines are disposed on different layers in the first area, wherein adjacent ones of the data lines are disposed on a same layer in the second area, and wherein the adjacent ones of the data lines disposed on the different layers in the first area are connected to the adjacent ones of the data lines disposed on the same layer in the second area via contact holes in the third area.

13. The LCD of claim 12, wherein adjacent data lines are connected to different test pads.

14. The LCD of claim 12, wherein the data lines are consecutively disposed between the pixel unit and the drive circuit unit and are sequentially connected to first to fourth test pads included in the test pads.

15. The LCD of claim 12, wherein data lines connected to pixels on odd-numbered column lines and data lines connected to pixels on even-numbered column lines are connected to the drive circuit unit by alternately passing through upper and lower dummy regions of the pixel unit.

16. The LCD of claim 15, wherein the test pads comprise first to fourth test pads, wherein data lines connected to pixels on (8k−7)-th, "k" being a natural number, or (8k−6)-th column lines are connected to the first test pad, wherein data lines connected to pixels on (8k−5)-th or (8k−4)-th column lines are connected to the second test pad, wherein data lines connected to pixels on (8k−3)-th or (8k−2)-th column lines are connected to the third test pad, and wherein data lines connected to pixels on (8k−1)-th or 8k-th column lines are connected to the fourth test pad.

17. The LCD of claim 16, wherein an electric potential of a test signal supplied to the first and second test pads is different from an electrical potential of a test signal supplied to the third and fourth test pads.

18. The LCD of claim 16, wherein an electric potential of a test signal supplied to the first and third test pads is different from an electrical potential of a test signal supplied to the second and fourth test pads.

19. The LCD of claim 12, wherein the data lines are alternately positioned in the first layer and the second layer in a first area, in which they extend from the drive circuit unit, and are all positioned in the second layer in the second area, in which they are connected to the pixels between the pixel unit and the drive circuit unit.

20. The LCD of claim 19, wherein the data lines positioned in the first layer in the first area are connected from a first line formed in the first layer to a second line formed in the second layer through contact holes in the third area.

21. The LCD of claim 19, wherein the data lines positioned in the second layer in the first area are connected from a second line formed in the second layer to a first line formed in the first layer via contact holes in the third area, and wherein the data lines positioned in the first layer in the third area are then connected from the first line formed in the first layer to the second line formed in the second layer via other contact holes.

22. The LCD of claim 19, wherein a spacing distance between adjacent data lines positioned in the second layer in the second area is wider than a spacing distance on a plane between adjacent data lines alternately positioned in the first layer and the second layer in the first area.

23. The LCD of claim 12, wherein each of the pixels has a thin film transistor comprising:

a semiconductor layer;

a gate electrode formed on the semiconductor layer with a gate insulting layer interposed therebetween; and source and drain electrodes formed on the gate electrode with an interlayer insulating layer interposed therebetween and connected to the semiconductor layer.

24. The LCD of claim 23, wherein a first line formed in the first layer in the first area is formed of the same material and in the same layer as the gate electrode, wherein a second line formed in the second layer in the first area is formed of the same material and in the same layer as the source and drain electrodes, and wherein adjacent ones of the data lines are alternately connected to the first line and the second line.

25. The LCD of claim 12, wherein a width of the LCD is larger than a height of the LCD so that the LCD is implemented as a landscape type display.

26. The LCD according to claim 19, wherein a spacing distance between adjacent data lines positioned in the second area is approximately equal to a spacing distance between adjacent data lines positioned in the first area.

* * * * *